(12) United States Patent
Tang et al.

(10) Patent No.: US 6,389,321 B2
(45) Date of Patent: May 14, 2002

(54) SIMULTANEOUS WIRED AND WIRELESS REMOTE IN-SYSTEM PROGRAMMING OF MULTIPLE REMOTE SYSTEMS

(75) Inventors: Howard S. Tang, San Jose; Albert Chan, Palo Alto; Cyrus Y. Tsui, Los Altos, all of CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 08/964,421

(22) Filed: Nov. 4, 1997

(51) Int. Cl.[7] ............................................. G05B 15/00
(52) U.S. Cl. ................................. 700/2; 700/3; 700/1
(58) Field of Search ............................. 326/38; 700/1–3

(56) References Cited

U.S. PATENT DOCUMENTS

| | | | | |
|---|---|---|---|---|
| 4,672,529 A | * | 6/1987 | Kupersmit | 700/10 |
| 4,849,928 A | | 7/1989 | Hauck | 716/1 |
| 5,237,218 A | * | 8/1993 | Josephson et al. | 326/38 |
| 5,309,351 A | * | 5/1994 | McCain et al. | 364/132 |
| 5,457,408 A | | 10/1995 | Leung | 326/38 |
| 5,543,730 A | | 8/1996 | Cliff et al. | 326/38 |
| 5,581,779 A | | 12/1996 | Hall et al. | 712/43 |
| 5,635,855 A | | 6/1997 | Tang | 326/38 |
| 5,734,868 A | | 3/1998 | Curd et al. | 716/5 |
| 5,751,163 A | | 5/1998 | Tang et al. | 326/38 |
| 5,833,469 A | * | 11/1998 | Ito et al. | 434/307 A |
| 5,984,498 A | * | 11/1999 | Lem et al. | 700/2 |
| 6,134,707 A | * | 10/2000 | Herrmann et al. | 709/208 |

FOREIGN PATENT DOCUMENTS

| | | |
|---|---|---|
| EP | 0 806 737 | 11/1997 |
| WO | 94 08399 | 4/1994 |

OTHER PUBLICATIONS

S. Nisbet et al.: "The XC6200DS Development System" Field–Programmable Logic and Applications. 7th International Workshop, FPL '97. Proceedings, London, UK, Sep. 1–3, 1997, pp. 61–68, XP000783988 ISBN 3–540–63465–7, 1997, Berlin, Germany, Springer–Verlag, Germany.

Brown et al.: "Remote Service Methods For Cellular Communication Systems," 1995 IEEE 45th Vehicular Technology Conference. Jul. 1995, vol. 1, pp. 170–174.

M. A. Moran: Customers' Needs Drive Complex PLDs to In–System Programmability. WESCON/'95 Conference, 'Microelectronics Communications Technology Producing Quality Products Mobile and Portable Power Emerging Technologies.' Nov. 1995, pp. 213–217.

* cited by examiner

*Primary Examiner*—William Grant
*Assistant Examiner*—Chad Rapp
(74) *Attorney, Agent, or Firm*—Skjerven Morrill MacPherson LLP; Edward C. Kwok

(57) ABSTRACT

An in-system programmable (ISP) system can be programmed by remote access from a host programming system. The remote access can be accomplished over a wired data network, a wireless data network, a radio channel, or any combination of the above. In the ISP system, an ISP controller receives control and programming data through the access interface to program ISP devices in accordance with ISP programming conventions. The ISP controller can be provided by an integrated circuit having a microprocessor core.

20 Claims, 8 Drawing Sheets

SIMULTANEOUS WIRED AND WIRELESS REMOTE IN-SYSTEM PROGRAMMING OF MULTIPLE REMOTE SYSTEMS

BACKGROUND OF THE INVENTION

1. Field of the Invention

The present invention relates to programmable integrated circuits, and in particular, the present invention relates to techniques for remotely programming multiple programmable systems sequentially or simultaneously over wired or wireless links between a programming host device and the programmable systems.

2. Discussion of the Related Art

Programmable devices that are programmed and reprogrammed without being removed from its application environment are widely preferred. One example of such a device is the "In-System programmable logic device" or "ISP PLD", available from Lattice Semiconductor Corp. One method for reprogramming ISP PLDs is disclosed in U.S. Pat. No. 5,635,855, entitled "Method for Simultaneous Programming of In-System Programmable Integrated Circuits", to Tang et al., filed on Jul. 21, 1995 and issued on Jun. 3, 1997.

In the prior art, a reprogrammable system is reprogrammed by a host programming device over a hard-wired connection. It is desirable to allow such a reprogrammable system to be reprogrammed over wired or wireless links established at the time of reprogramming, so as to allow reprogramming by a "remotely located" programmer, such as a portable programming device or a programming device physically located at any arbitrary location.

SUMMARY OF THE INVENTION

The present invention provides an in-system programmable (ISP) system which can be reprogrammed by remote access. Such a system allows the configurations of ISP devices to be updated in the field without requiring a hardwired connection to a tester or a programmer.

In one embodiment of the present invention, the ISP system includes an access interface for sending and receiving data over a communication link, so as to allow control and programming data used in ISP programming to be downloaded. Each ISP system includes one or more ISP controllers for programming multiple ISP devices according to the control and programming data received by the access interface. In this embodiment, each ISP device is programmed under the control of a programming clock signal and a mode signal. The ISP device receives control and programming data from a serial input signal and provides data output, including status and echoed control and programming data, through a serial data output signal.

The ISP system of the present invention can be coupled to a host programming system through a communication link that may include a wired or wireless data network, such as a telephone network, or a radio channel.

In one embodiment of the present invention, the ISP controller in an ISP system can receive data from the access interface either serially or in parallel. Further, a central processing unit can be provided to control the ISP system. The central processing unit can include a microprocessor, a random access memory for storing control and programming data received over the communication link and an address bus for specifying the memory locations or device accessed.

In one embodiment of the present invention, the ISP controller includes a microprocessor for controlling programming of the ISP devices under the ISP controller's control. Each ISP controller can program multiple ISP devices simultaneously. Thus, if multiple ISP controllers are present in the same ISP system under the control of a central processing unit, a large number of ISP devices can be simultaneously programmed by remote access.

In one embodiment of the present invention, the ISP system is programmed by remote access by a host programming system which includes one or more programming host computers. Each host computer includes a central processing unit, which may be a personal computer or an engineering workstation, and an access interface for accessing the communication link. These host units can be coupled by a computer network, which may be a local area network or a wide area network.

The present invention is better understood upon consideration of the detailed description below and the accompanying drawings.

DETAILED DESCRIPTION OF THE PREFERRED EMBODIMENTS

Figure 1:
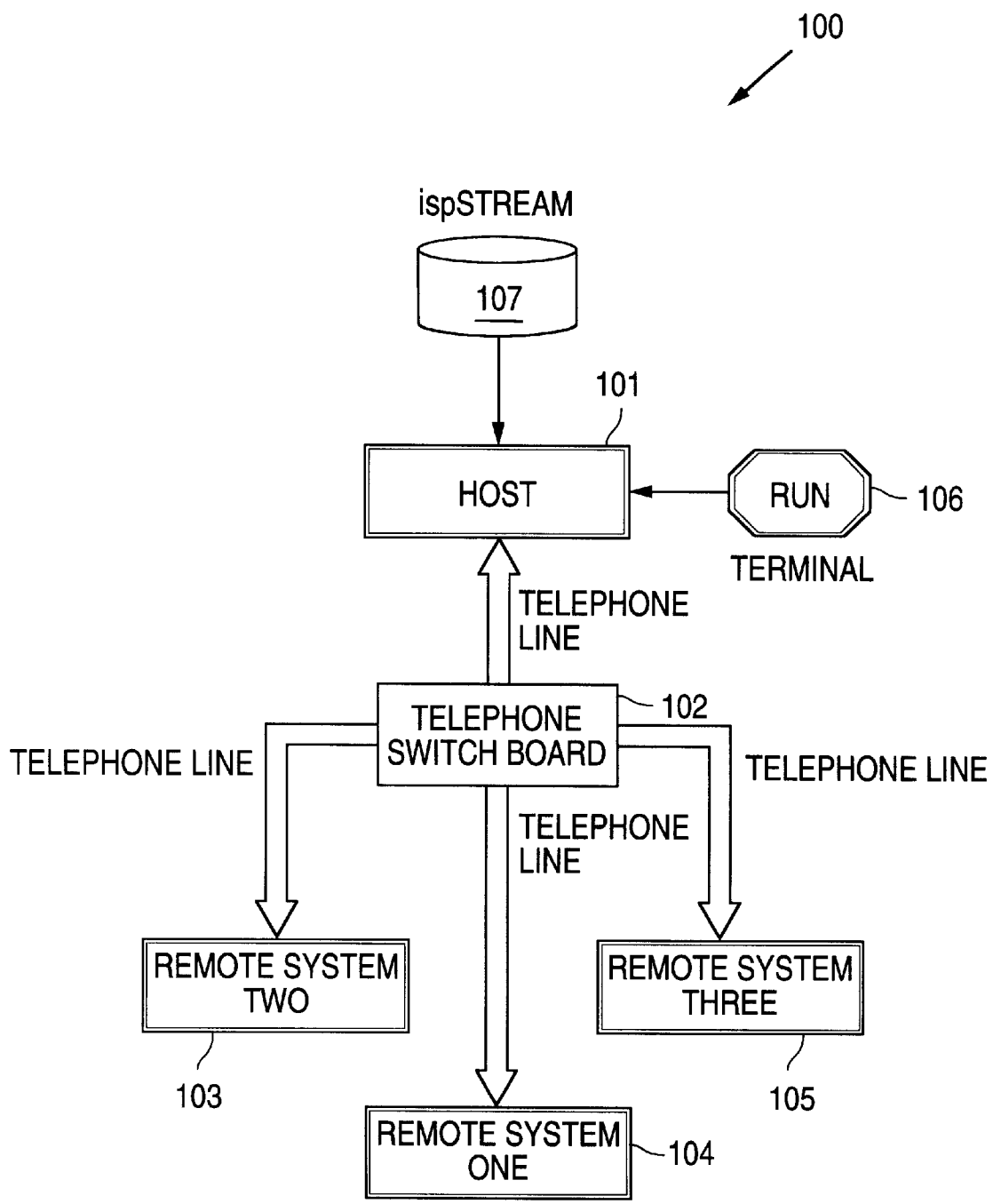
FIG. 1 shows a configuration 100 in a first embodiment of the present invention; in configuration 100, a programming host system 101 remotely accesses the ISP systems 103, 104 and 105 over a wired data network 102.

The present invention is specifically illustrated in this detailed description using configurations for remote accessing and programming an in-system programmable (ISP) system over wired or wireless links. In this description, to simplify discussion, like elements in the drawings are provided like reference numerals.

FIG. 1 illustrates a configuration 100 in a first embodiment of the present invention, in which the programming device remotely accesses ISP systems over a wired data network. As shown in FIG. 1, a programming device ("host programming system") 101 is shown coupled by a wired data network (e.g., a wired telephone network) 102 to remote ISP systems 103, 104 and 105. In configuration 100, reprogramming of ISP systems 103, 104 and 105 is initiated when host programming system 101 receives a command, represented by a signal from terminal 106, and programming data, represented by reprogramming data 107. In this embodiment, programming data 107 can be provided by an ispSTREAM file, which is a file format widely adopted for use with ISP PLDs available from Lattice Semiconductor Corporation. In an ispSTREAM file, programming commands ("control data") and programming data for an ISP PLD are compiled in a binary format. As discussed below, host programming system 101 and ISP systems 103, 104 and 105 are interfaced to telephone network 102 via modems.

Figure 2:
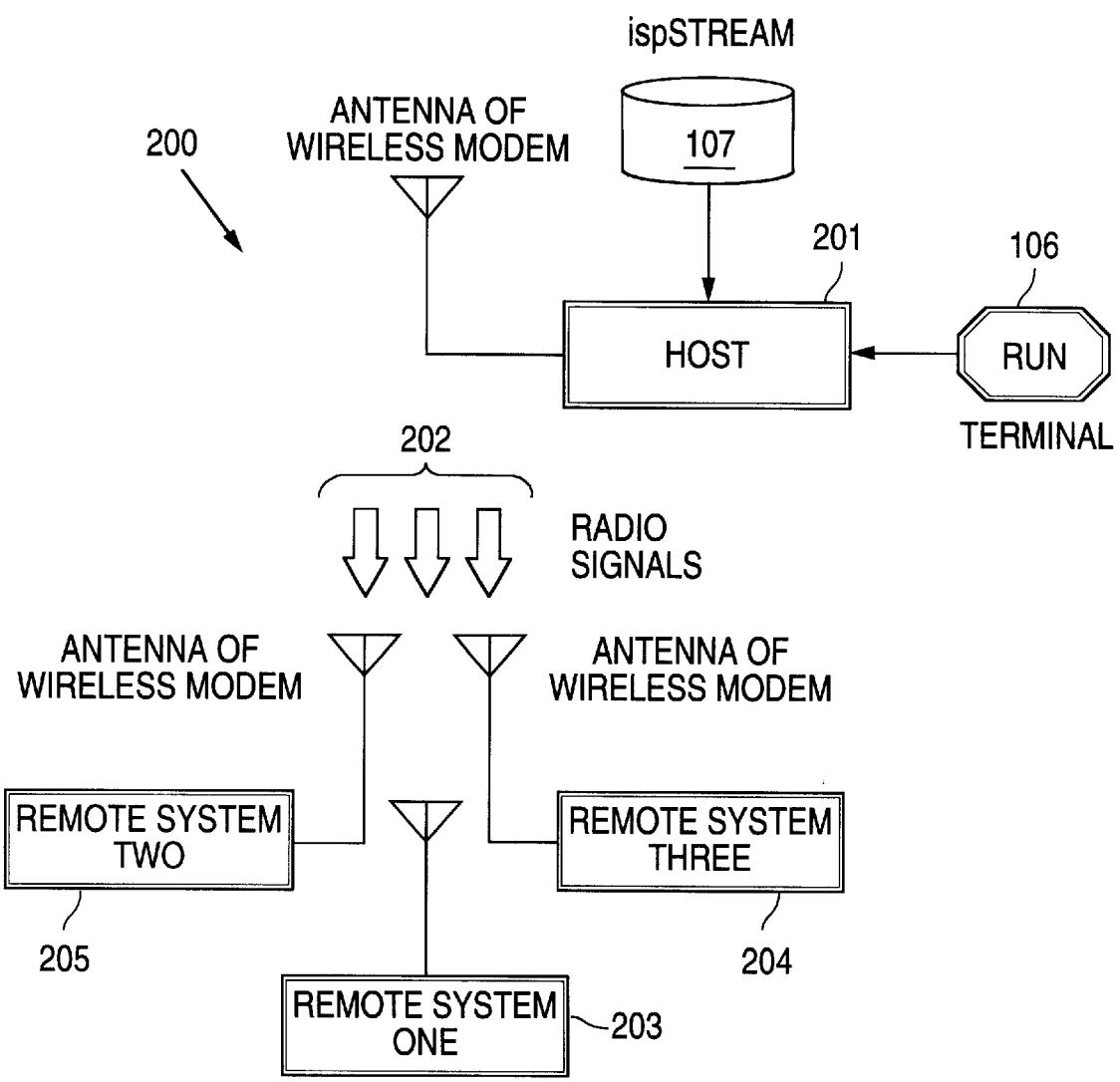
FIG. 2 shows a configuration 200 in a second embodiment of the present invention; in configuration 200, the wireless link between programming host system 201 and any one of ISP systems 203, 204 and 205 is provided by a wireless data network 202.
Figure 3:
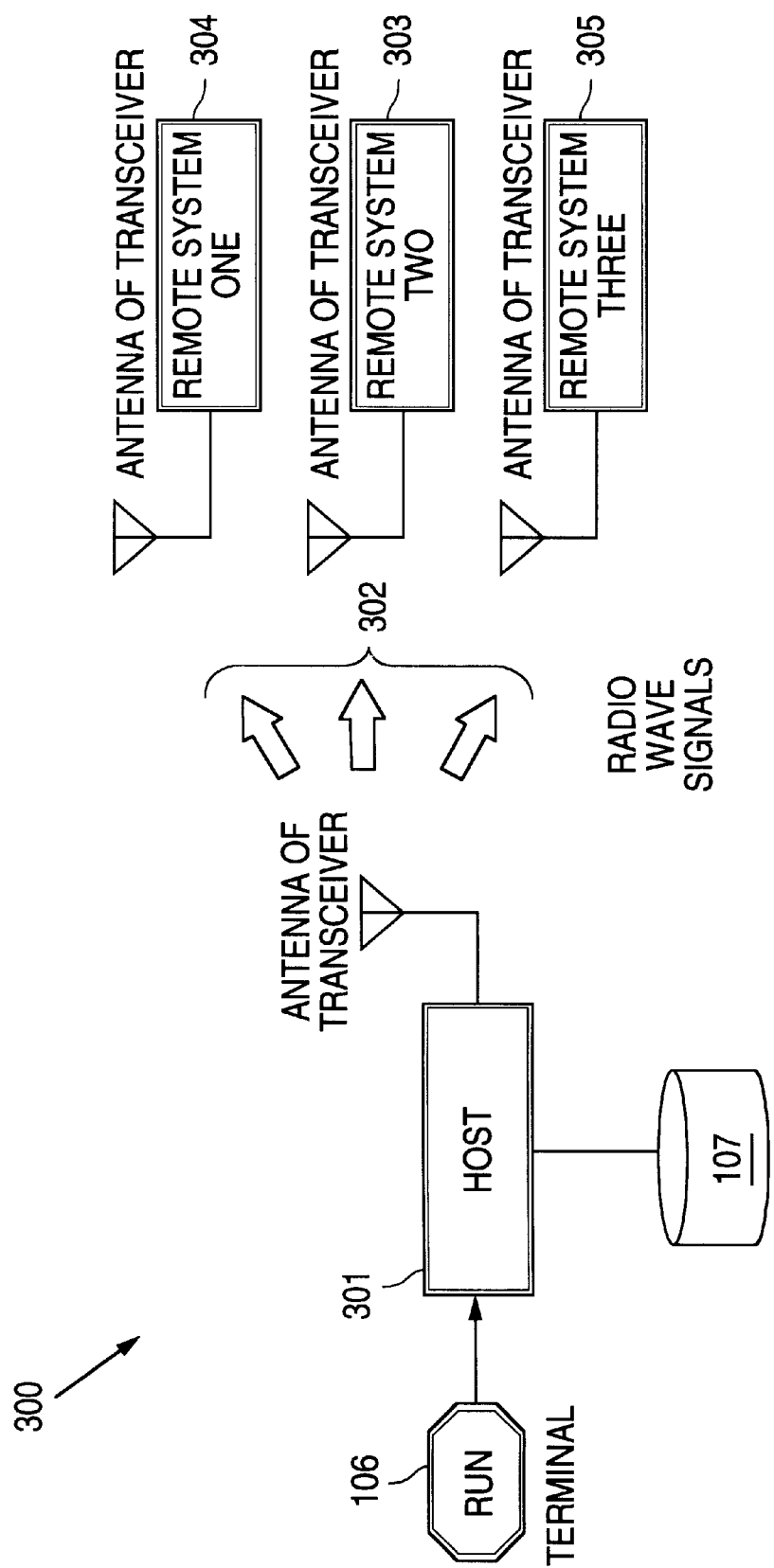
FIG. 3 shows a configuration 300 in a third embodiment of the present invention; in configuration 300, the wireless link between programming host system 301 and any one of ISP systems 303, 304 and 305 is provided by a broadcast radio channel 302.

Alternatively, reprogramming of ISP systems can also be provided under the present invention over wireless links. Wireless links can be provided over a wireless data network (e.g. cellular telephone network) or by a direct broadcast network in which the programming data is directly transmitted over a radio channel and received by the target ISP systems. FIG. 2 shows a configuration 200 in a second embodiment of the present invention. In configuration 200, the wireless link between programming host system 201 and any one of ISP systems 203, 204 and 205 is provided by a wireless data network 202, such as a cellular telephone network. Similarly, FIG. 3 shows a configuration 300 in a third embodiment of the present invention. In configuration 300, the wireless link between programming host system 301 and any one of ISP systems 303, 304 and 305 is provided by a broadcast radio channel 302.

Those skilled in the art would appreciate from configurations 100, 200 and 300 that many variations and modification of these configuration can be practiced within the scope of the present invention. For example, since gateways exist between wired and wireless telephone networks, the present invention can be practiced in a configuration in which some ISP systems are reprogrammed over a wired data network, while other ISP systems are reprogrammed over a wireless data network (e.g., a wireless telephone system) through a gateway in the wired data network.

Figure 4:
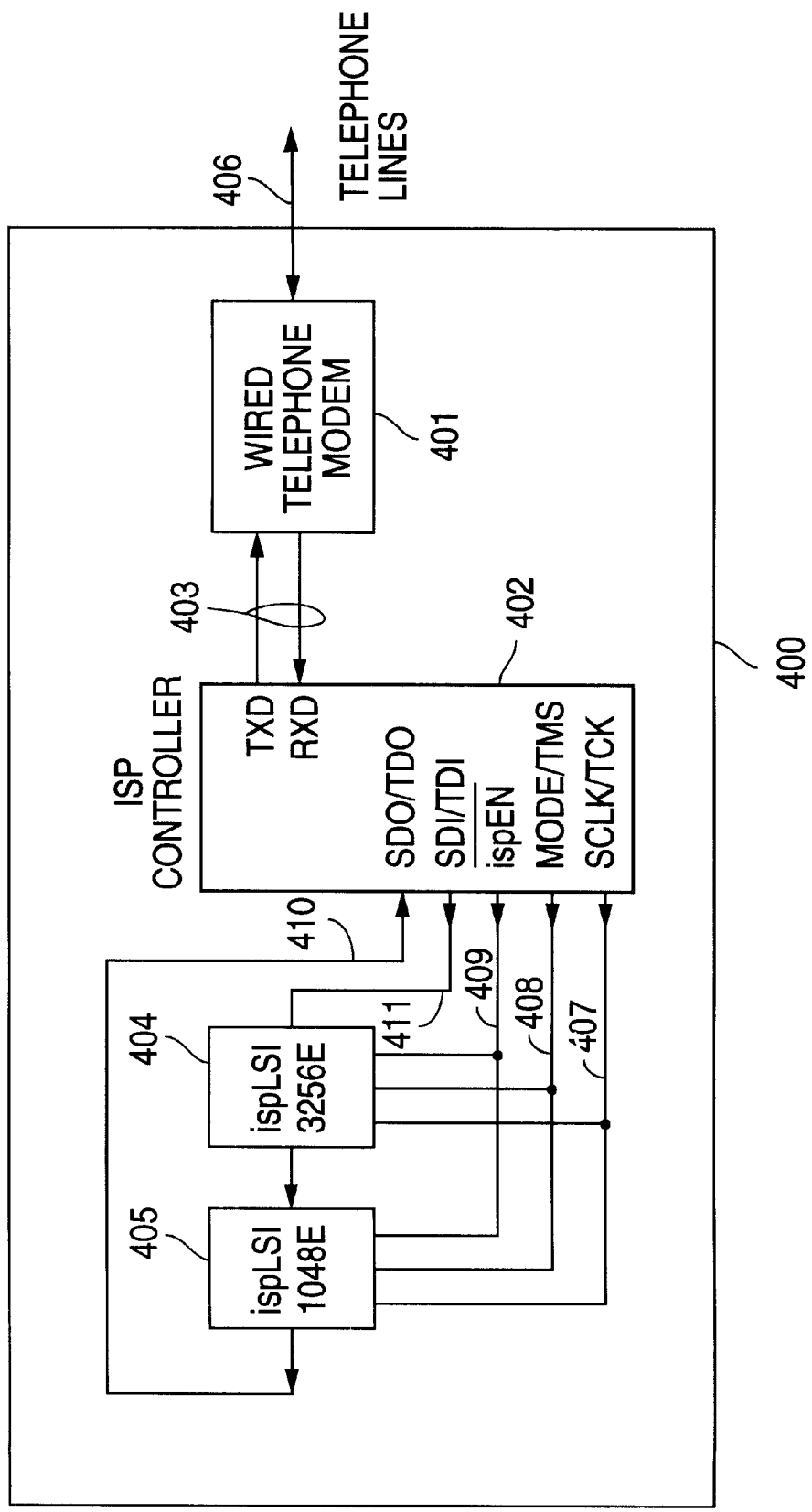
FIG. 4 shows an ISP system 400, suitable for implementing any of ISP systems 103, 104 and 105 of configuration 100 of FIG. 1.

ISP systems 103, 104 and 105 in configuration 100 can be each provided by ISP system 400 of FIG. 4. As shown in FIG. 4, ISP system 400 includes a remote access interface 401, which is coupled by a 2-wire serial data interface 403 to an ISP controller 402. In this embodiment, access interface 401 is implemented by a wired telephone modem to allow access to the telephone network over telephone lines 406. ISP controller 402, which is described in further detail below, performs the actual programming of ISP devices, such as ISP devices 404 and 405. As shown in FIG. 4, ISP devices 404 and 405 are daisy-chained to allow shifting control and programming data in and out of each of these ISP devices. Typically, data is shifted in and out of an ISP device through serially, e.g., serial input data terminal 411 ("SDI/TDI") and serial data output terminal 410 ("SDO/TDO"). In ISP system 400, data shifting is synchronized by a clock signal 407 ("SCLK/TCK"), which is provided by ISP controller 402 to each of ISP devices 404 and 405 in parallel. Control signal 408 ("MODE/TMS") indicates whether the data currently shifted into or out of the ISP device is control data or programming data. Programming mode is entered when the ISP mode enable signal ("ispEN") at terminal 409 is asserted. In the following, the SDI/TDI, SDO/TDO, ispEN, SCLK/TCK and MODE/TMS signals are referred to as ISP signals.

Figure 8:
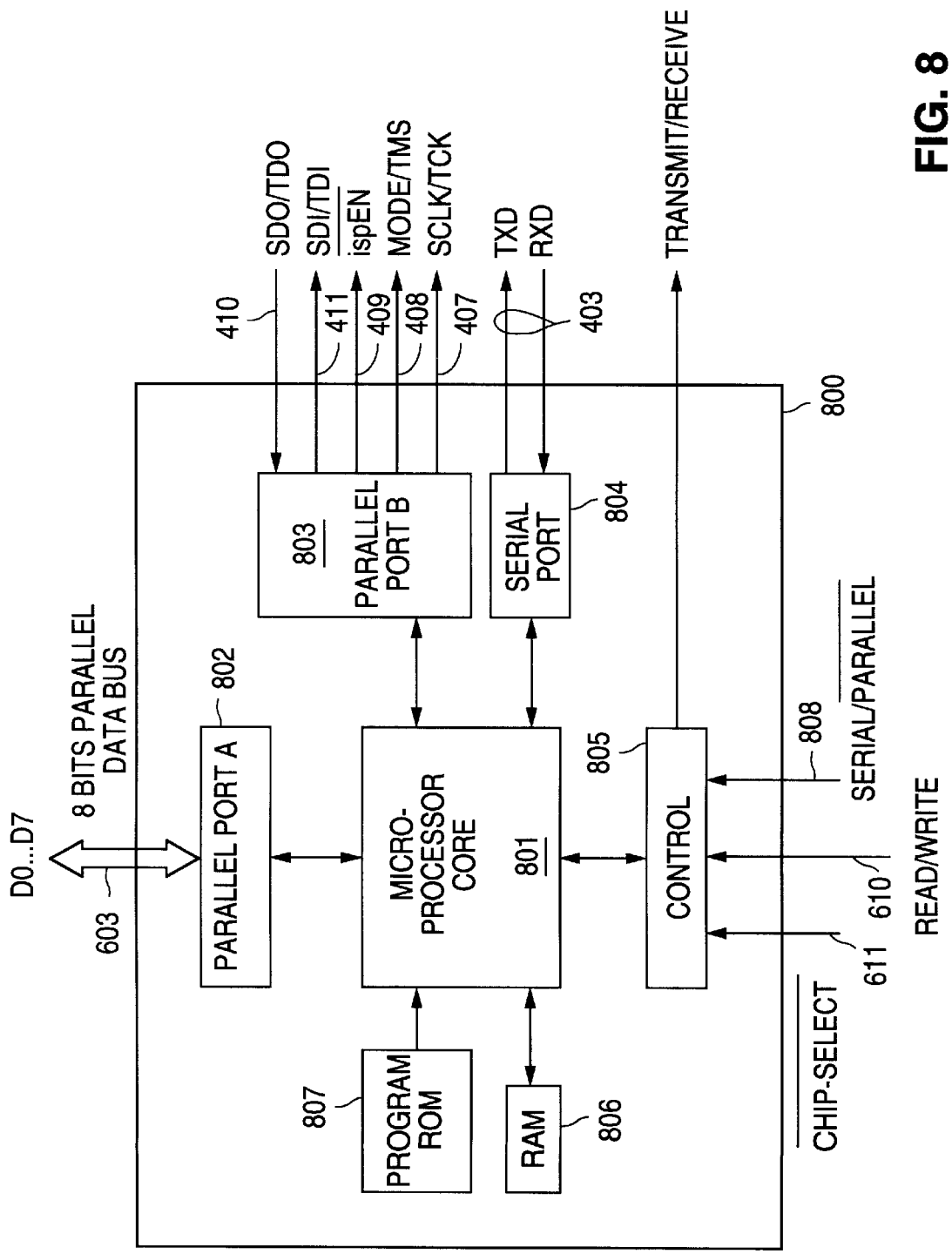
FIG. 8 shows an ISP controller 800 in one embodiment of the present invention.

FIG. 8 shows an ISP controller 800 in one embodiment of the present invention. ISP controller 800 can implement ISP controller 402 in each of configurations 100, 200 and 300. ISP controller 800 can be provided as an integrated circuit. As shown in FIG. 8, ISP controller 800 provides ISP signals SCLK/TCK, MODE/TMS, ispEN, SDI/TDI and SDO/TDO over a parallel port 803 on terminals 407, 408, 409, 411 and 410 respectively. ISP controller 800 is provided both a parallel port 803 and a serial port 804, thus allowing sending and receiving control and programming data, at the user's option (i.e., according to a control signal at terminal 808), over 8-bit parallel bus 603 or 2-wire serial bus 403. ISP controller 800 is controlled by a microprocessor core 801 running programs stored in non-volatile program read-only memory (ROM) 807. Random access memory 806 is provided as run time storage.

Since the programming of ISP devices is known to those skilled in the art, a detailed discussion of the syntax or semantics of any particular ISP "language" is omitted. A discussion regarding ISP programming can be found, for example, U.S. Pat. No. 5,237,218 to G. Josephson, issued on Aug. 19, 1993.

Figure 5:
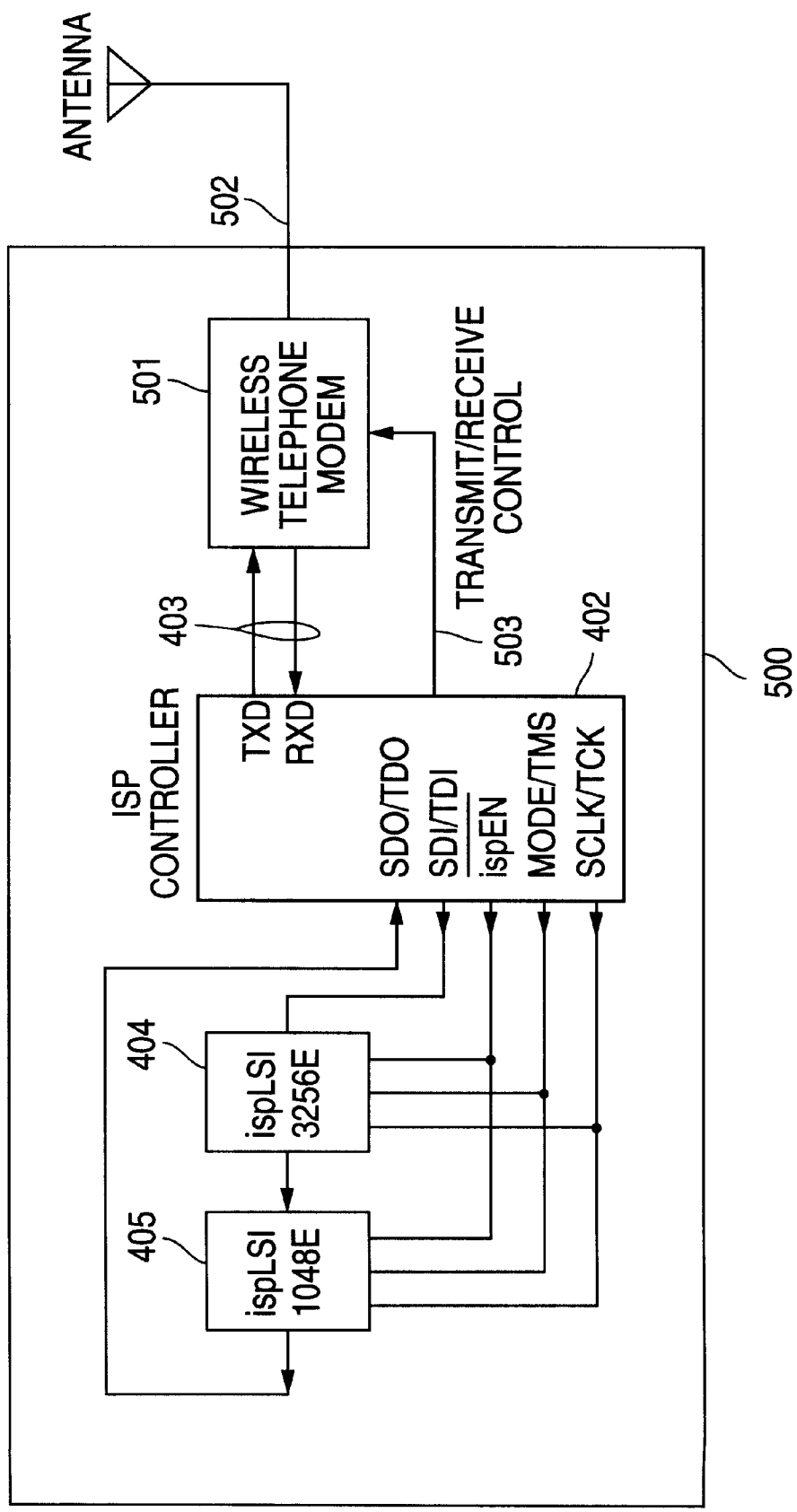
FIG. 5 shows an ISP system 500, suitable for implementing any of ISP systems 203, 204 and 205 of configuration 200 of FIG. 2.

An example of an ISP system suitable for implementing any of ISP systems 203, 204 and 205 is illustrated by ISP system 500 of FIG. 5. ISP system 500 is similar to ISP system 400, except that access interface 501 in ISP system 500 is implemented by a 30 wireless telephone modem, and the programming signals are transmitted through an antenna indicated by reference numeral 502.

An example of an ISP system suitable for implementing any of ISP systems 303, 304 and 305 is provided in ISP system 600. In ISP system 600, access interface.601 is provided by a transceiver, i.e., a radio communication device having both a transmitter and a receiver. To allow comparison among ISP systems 400, 500 and 600, like elements in these ISP systems are provided like reference numerals.

Figure 6:
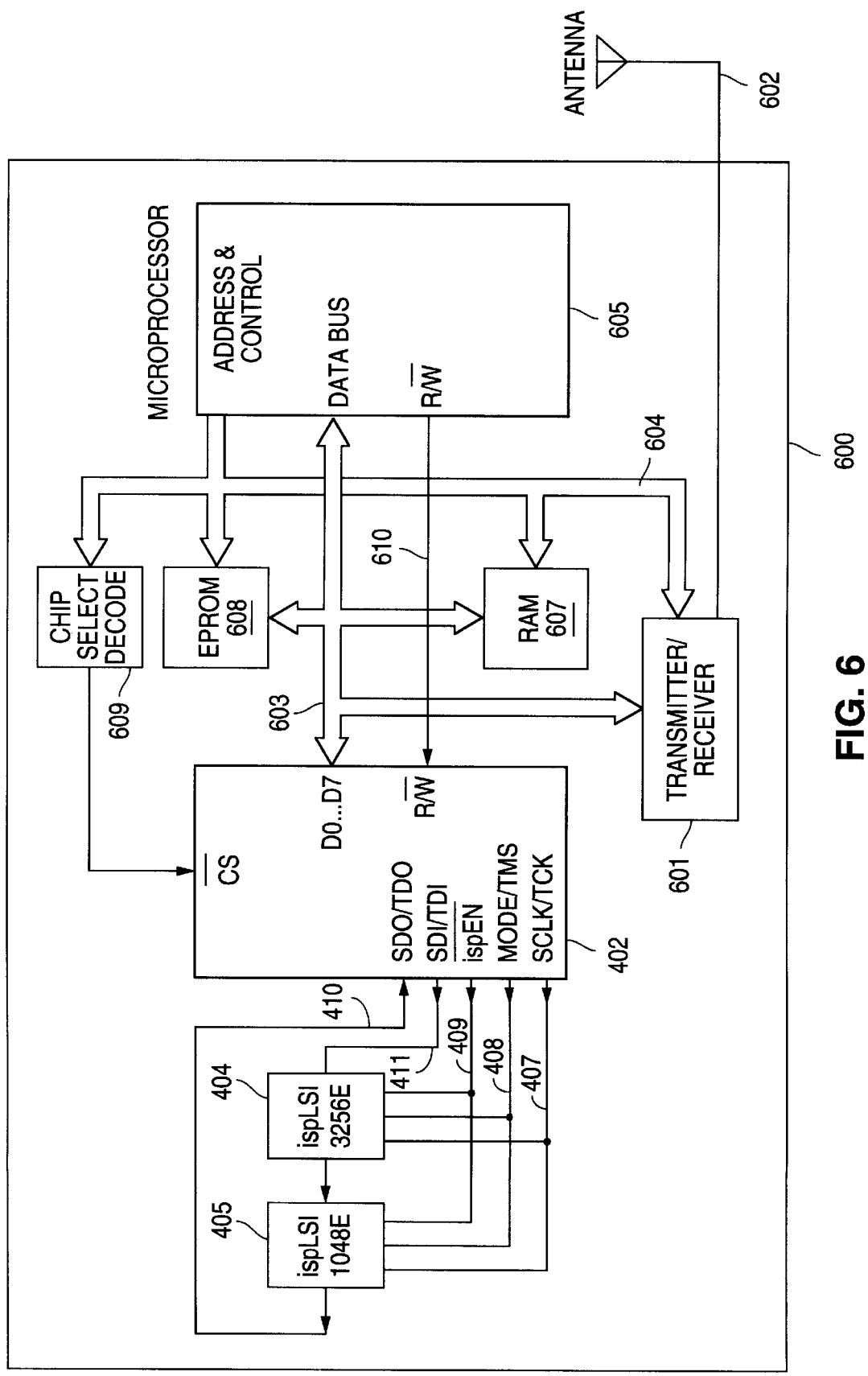
FIG. 6 shows an ISP system 600, suitable for implementing any of ISP systems 303, 304 and 305 of FIG. 3.

Unlike ISP systems 400 and 500, which each maintain a 2-wire serial data interface 403 between access interface 401 or 501 and the ISP controller in each of these ISP systems, ISP system 600 provides an 8-bit parallel data bus writable by access interface 601. In addition, ISP system 600 includes a microprocessor 605, which executes control programs stored in a non-volatile storage element 608 (e.g., an EPROM). In ISP system 600, programming data received from the transceiver at access interface 601 are stored in random access memory ("RAM") 607. RAM 607 and non-volatile storage element 608 can share a common address space. Further, as shown in FIG. 6, ISP system 600 may contain multiple ISP controllers each assigned an address in the shared common address space. An address in ISP system 600 is decoded by a chip-select decoder 609 to provide a chip select control signal for selecting one of the ISP controllers. The programming data stored in RAM 607 can be provided to ISP controller 402 via data bus 603 under the control of microprocessor 605, which provides a control signal 610 ("read/write") for latching the data into ISP controller 402. In this manner, the multiple ISP controllers in ISP system 600 can program a large number of ISP devices in parallel, without incurring large latencies due to the long daisy-chains of ISP devices. (Of course, the microprocessor-based ISP system taught by ISP system 600 can be adapted for use with any of access interfaces, whether implemented by wired or wireless data network interfaces.).

Figure 7:
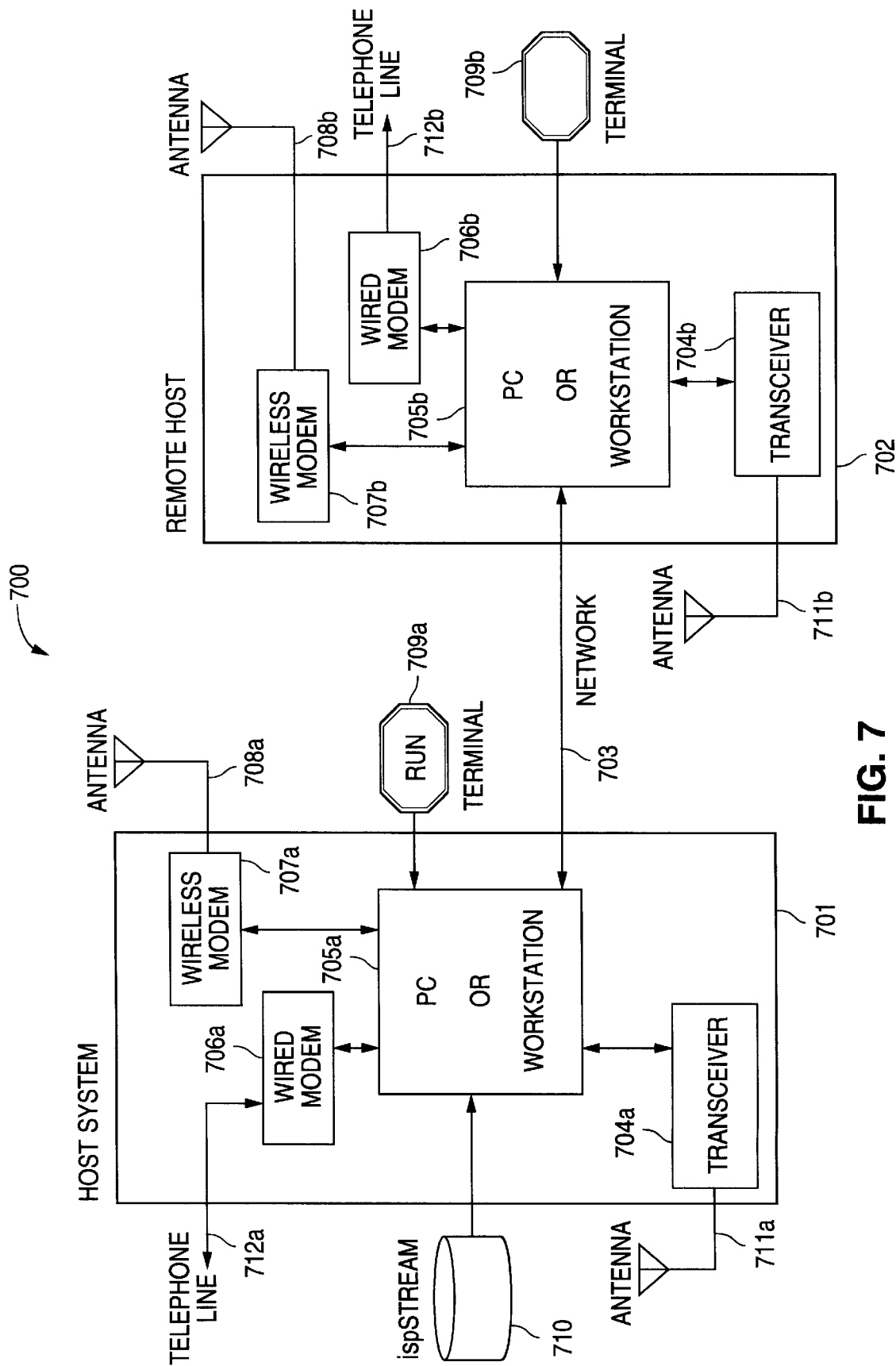
FIG. 7 is a programming host system 700, suitable for implementing any of programming host systems 101, 201 and 301 of FIGS. 1–3.

An example of a programming host system, such as any of programming host systems 101, 201 and 301, is shown in FIG. 7. FIG. 7 shows programming host system 700 as including host machines 701 and 702 coupled by a computer network 703. Computer network 703 can be a local area network, a dial-up network or a wide area network. For example, host machine 702 may be physically at the same geographical location as the ISP systems it programs, or host machine 701 can be a machine at a vendor site or a development site which provides updates of control and programming information to ISP devices on demand or periodically. Host machines 701 and 702 are each capable of supporting multiple remote ISP systems, such as any of remote ISP systems 103–105, 203–205 and 303–305.

As shown in FIG. 7, host machines 701 and 702 are similarly equipped. Thus, to simplify discussion, corresponding elements in host machines 701 and 702 are provided corresponding reference numerals, with a suffix "a" attached for elements in host machine 701 and a suffix "b" for corresponding elements in host machine 702. As seen in FIG. 7, host machine 701 includes a central processing unit ("CPU") 705*a*, which can be implemented by a workstation or a personal computer. CPU 705*a* sends control and programming data to a remote ISP system via (a) wired modem 706*a*, for such ISP system as ISP system 103 of FIG. 1, (b) wireless modem 707*a*, for such ISP system as ISP system 203 of FIG. 2, and (c) transceiver 704*a*, for such ISP system as ISP system 303. In FIG. 7, host system 701 can be controlled from terminal 709*a* and stores control and programming data in ispSTREAM files in storage element 710. In FIG. 7, host machine 702 obtains ispSTREAM files over network 703 through a server running on host machine 701.

When receiving control and programming data, the operations of an ISP system under configuration 100 of FIG. 1 (e.g., any one of ISP systems 103, 104 and 105) are as follows:

1.1 control and programming data arrive from host system 101 at the access interface over wired data network 102.

1.2 A wired modem in the ISP system, e.g., wired telephone modem 401 in ISP system 400 of FIG. 4, provides the control and programming data serially to the RXD line of the ISP controller's 2-wire serial data port (e.g., serial port 804 in ISP controller 800 of FIG. 8).

1.3 Status and response signals are received serially from the TXD line of the same serial data port to be transmitting by the wired telephone modem back to the host system as acknowledgment.

The operations of an ISP system using a wireless modem, e.g., any of ISP systems 203, 204 and 205, using a wireless modem such as wireless modem 501, are analogous to steps 1.1 to 1.4 above, except that such an ISP system would be implemented by, for example, ISP system 500 of FIG. 5, substituting the wired modem called for in these steps by a wireless modem.

The operations of an ISP system controlled by a microprocessor, e.g., ISP system 600 of FIG. 6, is slightly more complicated. The following steps illustrate an example of such an ISP system, in which control and programming data are transmitted over a radio channel:

2.1 Control and programming data arrive at the access interface, e.g., received by transceiver 601 from the radio channel.

2.2 While the control and programming data are received, the access interface provides the control and programming data as digital signals on a data bus (e.g., data bus 603) under the control of the microprocessor (e.g., microprocessor 605). The microprocessor, which executes a program stored in the non-volatile memory (e.g., EPROM 608), specifies an address on an address bus (e.g., address bus 604), so as to store the data on the data bus into memory (e.g., RAM 607). Step 2.2 is repeated until all control and programming data are stored into memory.

2.3 The microprocessor then asserts a control signal to select an ISP controller (e.g., ISP controller 402) and begins to retrieve the control and programming data from memory onto the data bus.

2.4 As each byte of data is provided on the data bus, the microprocessor asserts a write signal (e.g., read/write signal 610) to latch the data into the ISP controller.

2.5 In response to the control and programming data received, the ISP controller activates the ISP signals (i.e., ispEN, SDI/TDI, SDO/TDO, SCLK/TCK, MODE/TMS) to program the ISP devices.

2.6 When all control and programming data are provided to the selected ISP controller, status and response information are provided by the ISP controller on the data bus, under the microprocessor's control.

2.7 The microprocessor directs the access interface to provide the status and response information to the host programming system by transmitting a message over the radio channel.

The operations of the ISP controller are as follows:

3.1 The ISP controller waits in stand-by mode until arrival of control and programming data.

3.2 Upon receiving the control and programming data, the ISP controller sets the ISP devices into programming mode by asserting the ispEN control signal.

3.3 The ISP controller then reads an identification code (ID) from each ISP device in the daisy-chain. Each ID is clocked out of the SDO/TDO pin (i.e., terminal 410); during this time, the ISP controller provides a clock signal on the SCLK/TCK pin (i.e., terminal 407).

3.4 The ISP controller compares the ID of each ISP device with the ID specified in the programming data, to ensure that the correct ISP device is programmed.

3.5 The ISP controller then shifts the control and programming data serially into the target ISP device via the SDI/TDI pin (i.e., terminal 411).

3.6 As the control and programming data are shifted serially into the ISP device, the control and programming data are echoed back to the ISP controller via the SDO/TDO pin.

3.7 The ISP controller then calculates a checksum of the control and programming data echoed back from the ispLSI device.

3.8 The calculated checksum from the previous step is compared with a corresponding checksum in the control and programming data received from the access interface.

3.9 The ISP controller provides at either the serial output (i.e., 2-wire serial data port 403) or the parallel data bus 603, a code indicating whether the ISP device is correctly programmed.

The following is an exemplary sequence of events representative of the programming of an ISP device using the ISP signals:

4.1 The ISP device is set to SHIFT state.

4.2 An ERASE command is sent to the ispLSI device.

4.3 The ISP device is set to EXECUTE state.

4.4 The ISP signals are held steady for 200 milliseconds to erase any pattern from the ISP device.

4.5 The ISP device is set to SHIFT state.

4.6 An ADDRESS SHIFT command is sent to the ISP device.

4.7 The ISP device is set to EXECUTE state.

4.8 An address is sent to the ispLSI device.

4.9 The ISP device is set to SHIFT state.

4.10 A DATA SHIFT command is sent to ISP device.

4.11 The ISP device is set to EXECUTE state.

4.12 The programming data are then provided to the ISP device.

4.13 The ISP device is set to SHIFT state.

4.14 A PROGRAM command is sent to the ISP devices.

4.15 The ISP device is set to EXECUTE state.

4.16 The ISP signals are held steady for 40 milliseconds to program the new pattern into the ISP device.

4.17 The ISP device is set to SHIFT state.

4.18 A VERIFY command is sent to the ISP device.

4.19 An ISP device is set to EXECUTE state.

4.20 The ISP signals are held steady for 30 microseconds to verify the new pattern in the ISP device.

4.21 The ISP device is set to the SHIFT state.

4.22 A DATA SHIFT command is sent to the ISP device.

4.23 The ISP device is set to the EXECUTE state.

4.24 The programming data are shifted out, so that a checksum can be computed by the ISP controller to verify whether the ISP device is properly programmed.

The host programming system, e.g., host programming system 701, performs the following operations:

5.1 The host programming system retrieves from storage an ispSTREAM file, e.g., from disk storage into the memory of a microcomputer or a workstation.

5.2 The host programming system accesses the communication channel (e.g. wired data network 102, wireless data network 202, or radio channel 302) so as to reach the ISP systems.

5.3 The central processing unit (e.g. CPU 705*a*) of the host programming system activates the access interface (e.g. wired modem 706*a*, wireless modem 707*a*, or transceiver 704*a*) to send to the remote ISP systems an identity code identifying the host programming system.

5.4 If applicable, the host programming system can sign onto a second remote host programming system (e.g. host programming system 702) to allow further accesses to ISP systems.

5.5 The CPU then scans a binary code answer-back (e.g. a 64-bit integer) from each of the ISP systems and compares the binary code received to the binary code of the host programming system.

5.6 If the binary code received does not match the binary code of the host programming system, the CPU terminates the current access to the ISP systems.

5.7 If the binary code received matches the binary code of the host programming system, the CPU then transmits over the access interface the control and programming data of the ispSTREAM file.

5.8 The CPU then wait for a status response from each ISP systems.

5.9 Upon receiving from an ISP system a status indicating successful programming, the CPU terminates the communication with that ISP system.

The detailed description above is provided to illustrate specific embodiments of the present invention and is not intended to be limiting. Numerous variations and modifications within the scope of the invention are possible. The present invention is defined by the appended claims.

What is claimed is:

1. An in-system programmable (ISP) system remote from a host programming system, comprising:

a media access interface comprising a transmitter circuit and a receiver circuit for sending and receiving control and programming data over a communication link from said host programming system;

an ISP programmable logic device receiving a programming clock signal, a data input signal and providing a data output signal;

an ISP controller coupled to said media access interface and operatively coupled to said ISP programmable logic device via said data input signal, said programming clock signal and said data output signal, said ISP controller (a) receiving from said media access interface said control and programming data and (b) providing said control and programming data to program said ISP programmable logic device; and a central processing unit coupled to said ISP controller and said media access interface to control operations of said media access interface and said ISP controller.

2. An ISP system as in claim 1, wherein said communication link includes a portion of a wired data network.

3. An ISP system as in claim 1, wherein said communication link includes a portion of a wireless data network.

4. An ISP system as in claim 1, wherein said communication link includes a radio channel.

5. An ISP system as in claim 1, further comprising:

an address bus coupled to receive from said central processing unit a memory address;

a control terminal coupled to said central processing unit to provide a control signal; and a random access memory coupled to said ISP controller and said address bus, said random access memory allowing data storage and retrieval in response to said memory address and said control signal specifying whether a read operation or a write operation is to be performed.

6. An ISP system as in claim 5, further comprising a writable control store for said central processing unit provided in non-volatile memory.

7. An ISP system as in claim 1, further comprising a plurality of ISP controllers each controlling the programming of multiple ISP programmable logic devices; wherein said central processing unit is coupled to said plurality of ISP controllers to control operations of said plurality of ISP controllers.

8. An ISP system as in claim 7, further comprising a decoder coupled to said plurality of ISP controllers, said decoder providing a select signal for selecting one of said plurality of ISP controllers.

9. An ISP system as in claim 8, further comprising:

an address bus coupled to receive from said central processing unit a memory address;

a control terminal coupled to said central processing unit for providing a control signal to said plurality of ISP controllers; and a random access memory coupled to said plurality of ISP controllers and said address bus, said random access memory allowing data storage and retrieval in response to said memory address and said control signal specifying whether a read operation or a write operation is to be performed;

wherein said decoder decodes said memory address to provide said select signal.

10. An ISP system as in claim 1, wherein said host programming system comprises a host central processing unit and an access interface receiving said control and programming data from said host central processing unit for transmission over said communication link.

11. An ISP system as in claim 10, wherein said host programming system further comprises storage means from which said host central processing unit retrieves said control and programming data.

12. An ISP system as in claim 1, wherein said host programming system further comprises a first host central processing unit and a second host central processing unit coupled by a computer network.

13. An ISP system as in claim 12, wherein said computer network includes a wide area network.

14. An ISP system as in claim 1, further comprising:
a data bus coupled to said media access interface, said ISP controller and said central processing unit;
wherein said ISP controller receives said control and programming data from said media access interface over said data bus, and said central processing unit controls operations of said media access interface and said ISP controller via said data bus.

15. A method for remotely programming an in-system programmable (ISP) system, comprising:
receiving control and programming data from a remote host programming system at an access interface of said ISP system;
executing a program at a central processing unit in said ISP system to generate an address;
storing said control and programming data in a memory in said ISP system at a location specified by said address;
selecting an ISP controller responsive to a control signal provided by said central processing unit;
retrieving said control and programming data from said memory;
latching said control and programming data into said ISP controller responsive to a write signal provided by said central processing unit;
activating ISP signals at said ISP controller responsive to said control and programming data received; and
programming an ISP programmable logic device responsive to said ISP signals from said ISP controller.

16. The method of claim 15, further comprising:
providing status and response information from said ISP controller to said access interface; and
transmitting said status and response information to said remote host programming system.

17. A method for programming an in-system programmable (ISP) system remote from a host programming system, comprising:

providing within said ISP system a central processing unit, a plurality of ISP controllers, and a plurality of ISP programmable devices;
receiving within said ISP system control and programming data from said remote host programming system;
selecting with said central processing unit an ISP controller from the plurality of controllers and providing to said selected controller said control and programming data; and
responsive to said control and programming data, programming with said selected ISP controller one or more ISP programmable devices specified in said data.

18. The method of claim 17, wherein the central processing unit selects an ISP controller based on said control and programming data.

19. The method of claim 17, further comprising:
providing within said ISP system a media access interface;
wherein said receiving within said ISP system control and programming data from said remote host programming system comprises receiving said control and programming data at said media access interface of said ISP system; and
wherein said programming with said selected ISP controller one or more ISP programmable devices specified in said data comprises receiving at said one or more ISP programmable devices a programming clock signal and a data input signal, and generating at said one or more ISP programmable devices a data output signal.

20. An in-system programmable (ISP) system remote from a host programming system, comprising:
means for sending and receiving control and programming data over a communication link from said host programming system, said means being an interface means;
means for receiving a programming clock signal, a data input signal and providing a data output signal, said means being an ISP programmable logic means;
means for (a) receiving from said interface means said control and programming data and (b) providing said control and programming data to program said ISP programmable logic means, said means being an ISP controller means; and
means for controlling operations of said interface means and said ISP controller means, said means being a processing means.

* * * * *